(12) United States Patent  (10) Patent No.: US 9,287,320 B2
Park  (45) Date of Patent: Mar. 15, 2016

(54) SEMICONDUCTOR DEVICE AND OPERATING METHOD THEREOF

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 14/018,036

(22) Filed: Sep. 4, 2013

(65) Prior Publication Data

US 2014/0312960 A1  Oct. 23, 2014

(30) Foreign Application Priority Data

Apr. 19, 2013  (KR) .......................... 10-2013-0043727
Apr. 19, 2013  (KR) .......................... 10-2013-0043728

(51) Int. Cl.
*H01L 27/20* (2006.01)
*H01L 41/09* (2006.01)

(52) U.S. Cl.
CPC ............ *H01L 27/20* (2013.01); *H01L 41/0986* (2013.01)

(58) Field of Classification Search
None
See application file for complete search history.

(56) References Cited

U.S. PATENT DOCUMENTS

| 5,188,286 | A | * | 2/1993 | Pence, IV | 236/1 F |
| 5,872,372 | A | * | 2/1999 | Lee et al. | 257/254 |
| 5,883,419 | A | * | 3/1999 | Lee et al. | 257/417 |
| 7,898,036 | B2 | * | 3/2011 | Fukutome | 257/368 |
| 8,105,928 | B2 | * | 1/2012 | Lin et al. | 438/539 |
| 8,125,699 | B2 | * | 2/2012 | Akedo et al. | 359/199.1 |
| 8,493,006 | B2 | * | 7/2013 | Adachi et al. | 318/116 |
| 8,508,217 | B2 | * | 8/2013 | Eguchi | 324/123 R |
| 2006/0138905 | A1 | | 6/2006 | Gonzales et al. | |
| 2006/0220090 | A1 | * | 10/2006 | Metz et al. | 257/310 |
| 2010/0315862 | A1 | * | 12/2010 | Huang et al. | 365/156 |
| 2011/0204500 | A1 | | 8/2011 | Lim et al. | |
| 2011/0248322 | A1 | * | 10/2011 | Wong et al. | 257/288 |
| 2013/0223139 | A1 | * | 8/2013 | Okano | 365/157 |
| 2014/0060210 | A1 | * | 3/2014 | Jeon et al. | 73/862.68 |

FOREIGN PATENT DOCUMENTS

| KR | 1020060068854 | 6/2006 |
| KR | 100774673 | 11/2007 |
| KR | 1020110014867 | 2/2011 |

* cited by examiner

*Primary Examiner* — Thomas J Hiltunen
(74) *Attorney, Agent, or Firm* — IP & T Group LLP (57) ABSTRACT

A substrate including a plurality of transistors, and a piezo-electric formed to be contacted with the substrate. The piezo-electric is formed heat-expendably in a direction parallel to a gate direction of the transistors.

19 Claims, 7 Drawing Sheets

SEMICONDUCTOR DEVICE AND OPERATING METHOD THEREOF

CROSS-REFERENCE TO RELATED APPLICATIONS

The present application claims priorities of Korean Patent Application No. 10-2013-0043727, filed on Apr. 19, 2013 and Korean Patent Application No. 10-2013-0043728, filed on Apr. 19, 2013, which are incorporated herein by reference in their entireties.

BACKGROUND

1. Field

Exemplary embodiments of the present invention relate to a semiconductor fabrication technology, and more particularly, to a semiconductor device including a piezoelectric and an operating method thereof.

2. Description of the Related Art

In general, when an application such as a high-performance operation or a low-power operation is determined, a semiconductor may need to have an optimized application corresponding thereto.

For example, even within the same technology, applications of a main device, such as threshold voltage and current, may be divided into a general purpose (GP), low power (LP), and high performance (HP). Furthermore, each of the applications of the main device may be subdivided into low, medium, standard, high, and ultra high depending on the threshold voltage thereof. According to the subdivisions, devices are fabricated.

That is, the threshold voltages and currents of semiconductor devices are determined according to the use thereof. When low power is selected, performance may be degraded. In order to improve the performance, the power consumption may be increased.

As described above, the conventional semiconductor device has difficulties in satisfying applications in a trade-off relation.

SUMMARY

Various exemplary embodiments of the present invention are directed to a semiconductor device that may satisfy the opposite characteristics at the same time and an operating method thereof.

In accordance with an exemplary embodiment of the present invention, a semiconductor device includes a substrate including a plurality of transistors, and a piezoelectric formed to be contacted with the substrate. The piezoelectric is formed heat-expendably in a direction parallel to a gate direction of the transistors.

In accordance with another exemplary embodiment of the present invention, a semiconductor device includes chip comprising a logic device and a power device and a heat dissipating plate formed over the power device. The power device may include an NMOS transistor. The heat dissipating plate may include bimetal. The heat dissipating plate may include a metal having a larger thermal expansion coefficient than silicon nitride. The heat dissipating plate 406 may include aluminum (Al). The chip may include a semiconductor package having passed through a device and packaging process and the heat dissipating plate may be connected to the bottom of a semiconductor package serving as a heat sink.

The substrate may include a semiconductor chip having passed through a packaging process. Furthermore, the substrate may include any one selected from the group consisting of SRAM, Flash memory, DRAM, digital logic, and a converter.

The substrate may include a device in which a gate electrode of the transistor is fixed to one direction.

The piezoelectric may include any one material selected from the group consisting of ferroelectric ceramic, piezoelectric single crystal, and zinc oxide. Furthermore, the piezoelectric may include any one ferroelectric ceramic selected from PZT (Pb(Ti, Zr)O$_3$), PbTiO$_3$, and BaTiO$_3$.

The substrate may include a control unit and a comparison unit. Alternatively, the substrate may include a control unit, a comparison unit, and a sensing unit.

In accordance with another exemplary embodiment of the present invention, a semiconductor device includes a substrate including a plurality of NMOS transistors and a plurality of PMOS transistors, and a piezoelectric formed to be contacted with the substrate. The piezoelectric is formed heat-expendably in at least a direction parallel to a gate direction of the PMOS transistors.

The NMOS transistor may include a pull-down transistor and a pass transistor, and the PMOS transistor may include a pull-up transistor.

The substrate may include an I-type active region. The pull-down transistor, the pull-up transistor, and the pass transistor may be arranged in the same direction.

The substrate may include an O-type active region. The pull-down transistor and the pull-up transistor may be arranged in the same direction, and the pass transistor may be arranged in a direction perpendicular to the pull-down transistor and the pull-up transistor.

In accordance with still another exemplary embodiment of the present invention, an operating method of a semiconductor device includes forming a semiconductor device including a device, a control unit, a comparison unit, and a piezoelectric, inputting an external command to the control unit, applying, by the control unit, a voltage to the piezoelectric, applying, by the piezoelectric, a stress to the device, determining performance of the device, and transmitting a signal to the control unit.

The semiconductor device may further include a sensing unit to measure the temperature of the device, and the comparing of the performance of the device and the measuring of the temperature of the device may be performed at the same times.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
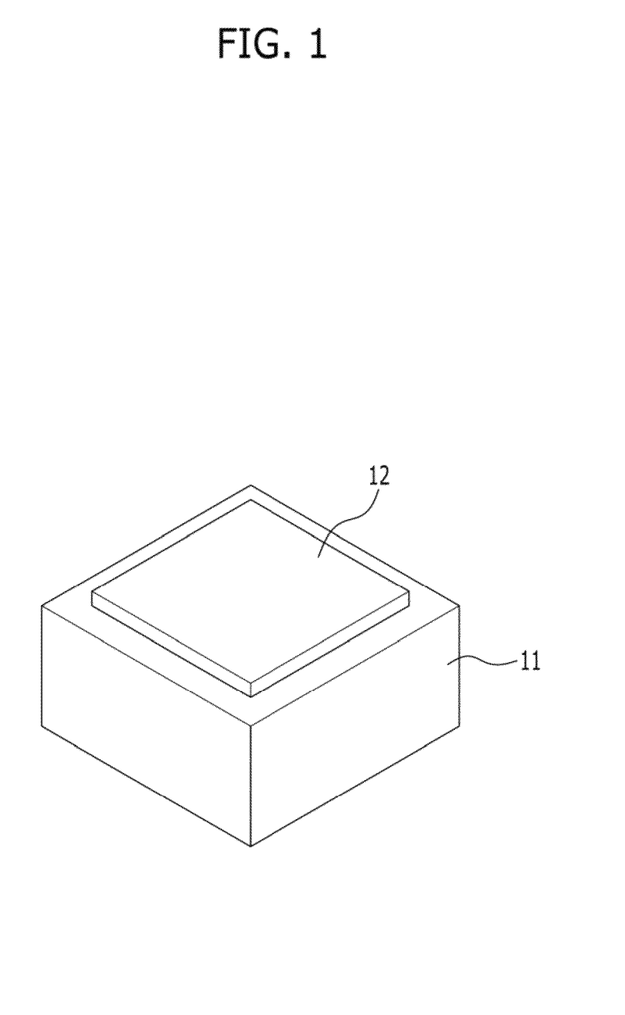
FIG. 1 is a perspective view of a semiconductor device in accordance with an embodiment of the present invention.
Figure 2A:
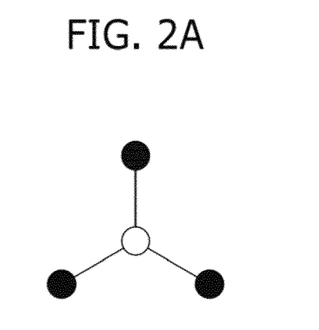
FIGS. 2A to 2C are state transition diagrams depending on a voltage.
Figure 2B:
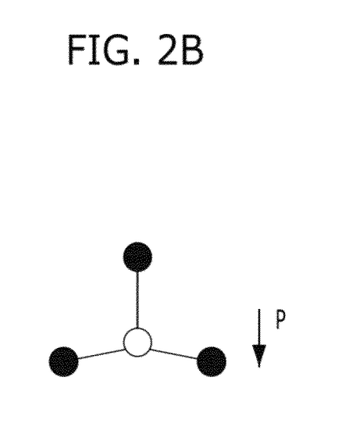
Figure 2C:
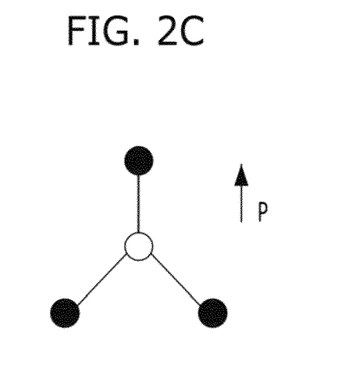

FIG. 1 is a perspective view of a semiconductor device in accordance with an embodiment of the present invention. FIGS. 2A to 2C are state transition diagrams depending on a voltage.

Referring to FIG. 1, a piezoelectric 11 is attached to a substrate 12 including a plurality of transistors (or gates). Furthermore, a voltage is applied across the piezoelectric 11. According to the applied voltage, the piezoelectric is strained. Through the strain of the piezoelectric 11, stress is applied to the substrate 12. The stress changes the operating characteristics of the substrate 12.

When stress applied in a direction perpendicular to the gate of the transistor, a current of NMOS is proportional to the stress and a current of PMOS is inverse proportional to the stress. When stress applied in a direction parallel to the gate of the transistor, current of NMOS and PMOS are proportional to the stress. Since the current of PMOS is proportional to the stress when stress applied in a direction parallel to the gate of the transistor, the gate of the PMOS may be in a direction parallel to the piezoelectric 11.

Figure 3A:
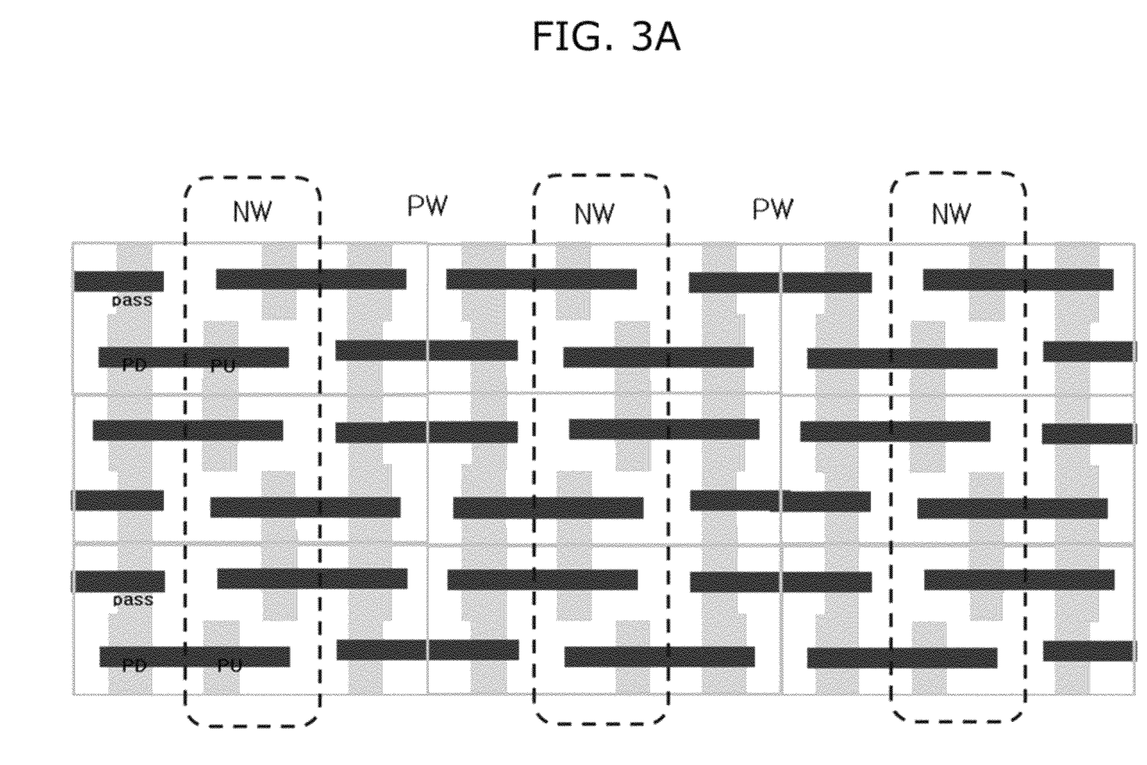
FIGS. 3A and 3B are arrangement diagrams illustrating the cell array layout of SRAM.
Figure 3B:
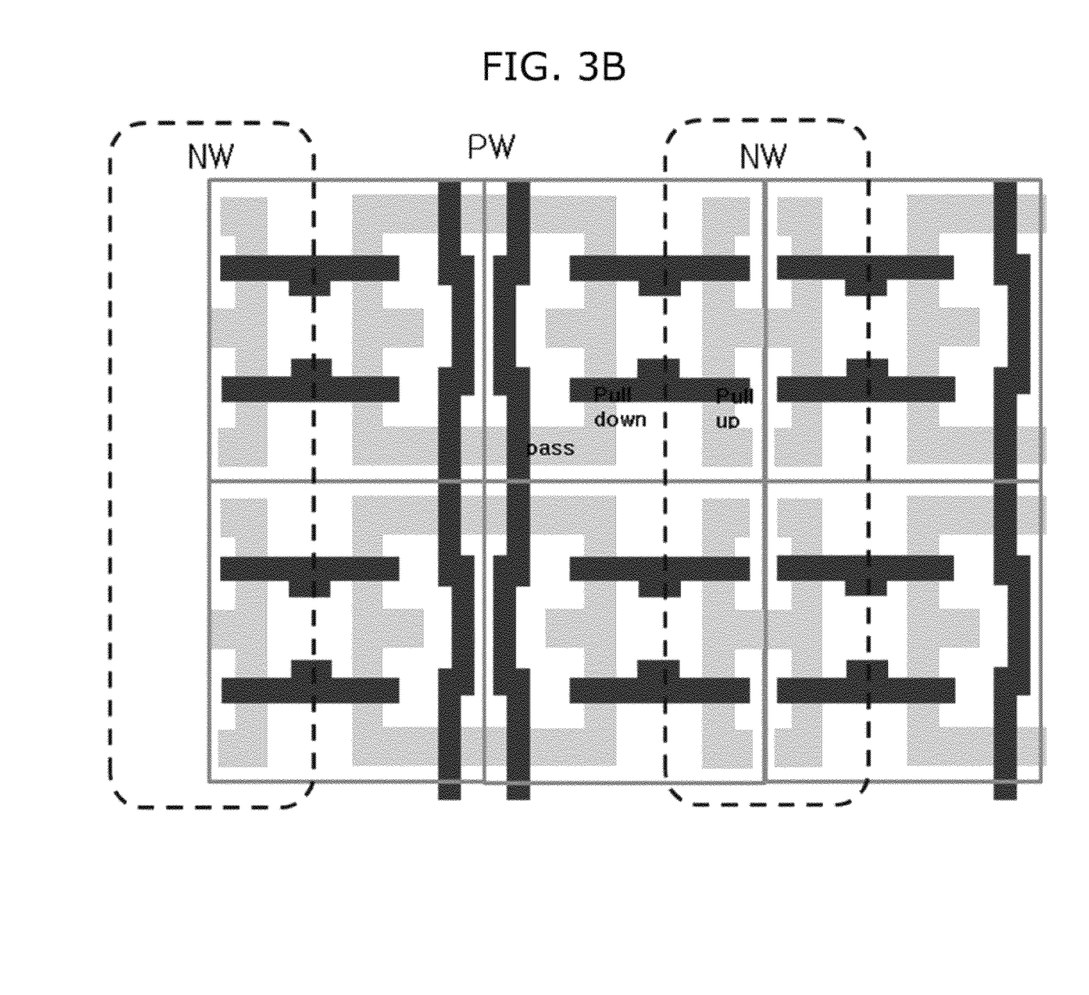

Thus, the substrate 12 may include a device of which a gate direction is fixed to one side shown in FIG. 3A to 3B. The substrate 12 may include a semiconductor chip having passed through a packaging process. The substrate 12 may include any one device selected from the group consisting of SRAM, Flash memory, DRAM, digital logic, and a converter (for example, a DC-DC converter having power transistors arranged in the same direction). In particular, any one device selected from the group consisting of Flash memory, DRAM, digital logic, and a converter may include a device of which the gate direction is fixed to one side. SRAM may include an I-type SRAM or an O-type SRAM. The relation between the gate direction and the strain direction will be described below in detail with reference to FIGS. 3A and 3B.

The piezoelectric 11 may include a material that causes a mechanical strain such as expansion or contract when a voltage is applied. The piezoelectric 11 may include a ferroelectric ceramic. For example, the ferroelectric ceramic may include any one selected from the group consisting of PZT (Pb(Ti, Zr)O$_3$), PbTiO$_3$, and BaTiO$_3$. Furthermore, the piezoelectric 11 may include a piezoelectric single crystal (for example, quartz) or zinc oxide (ZnO). However, the piezoelectric 11 is not limited thereto, and may include all kinds of piezoelectric materials having large output mechanical energy with respect to input electricity.

The piezoelectric 11 may have a normal state in which a voltage is not applied, as illustrated in FIG. 2A. Furthermore, when a voltage is applied, the piezoelectric may be mechanically strained. For example, the piezoelectric 11 may be contracted as illustrated in FIG. 2B or expanded as illustrated in FIG. 2C.

When a voltage is applied to the piezoelectric 11, so as to apply a tensile stress to the substrate 12, in a direction parallel to the gate, the performance of the device may be improved because the currents of the NMOS and PMOS transistors are increased. When a voltage is not applied to the piezoelectric 11, a small current flows through the device because stress is not applied to the substrate 12. Thus, leakage current may be reduced.

As a result, even when chips having the same device are fabricated, the chips may be operated in the high performance mode or the low power mode according to whether or not a voltage is applied to the piezoelectric 11. Furthermore, when the case in which a voltage is not applied is set to the low performance mode during the fabrication process, leakage current in a standby state may be reduced. Thus, standby power consumption may be reduced. A method for adjusting the voltage of the piezoelectric 11 to control the operating characteristics of the substrate 12 will be described below with reference to FIGS. 6A and 6B.

FIG. 1 illustrates that the piezoelectric 11 has a larger size than the substrate 12, but the sizes of the substrate 12 and the piezoelectric 11 may be adjusted as occasion demands. FIG. 1 illustrates that the piezoelectric 11 is attached to the bottom of the substrate 12, but the positions of the substrate 12 and the piezoelectric 11 may be changed as occasion demands.

FIGS. 3A and 3B are arrangement diagrams illustrating the cell array layout of SRAM. FIG. 3A is an arrangement diagram illustrating a cell array of an I-type SRAM, that is, bar-type SRAM. FIG. 3B is an arrangement diagram illustrating a cell array of an O-type SRAM. For convenience of description, suppose that a first direction is set to a perpendicular direction of the drawings and a second direction is set to a horizontal direction of the drawings.

Referring to FIG. 3A, an SRAM cell may include a plurality of active regions isolated from each other and a plurality of transistors formed over the respective active regions. The respective active regions are isolated by an isolation region. Each of rectangles isolated by a solid line indicates an SRAM cell. As illustrated in FIG. 3A, a plurality of SRAM cells may be arranged along the first and second directions. SRAM cells adjacent in the first and second directions may be arranged mirror-symmetrically with each other.

Each of the SRAM cells may include a PMOS active region P-type well (PW) and an NMOS active region N-type well (NW) indicated by a dotted line. The NMOS active regions are extended in the first direction, and may be formed in a line type where the NMOS active regions of the SRAM cells arranged in the first direction are connected to each other. The PMOS active regions may be formed in a bar type having a major axis (first direction) and a minor axis (second direction), and may be connected to SRAM cells adjacent to each other in the first direction.

Each of the SRAM cells may include a pair of NMOS active regions and a pair of PMOS active regions. The pair of PMOS active regions may be arranged between the pair of NMOS active regions.

Each of the SRAM cells may include a pull-down gate PD, a pull-up gate PU, and a pass gate Pass. The pull-down gate and the pull-up gate may be electrically connected to each other through a sharing gate crossing the NMOS active region and the PMOS active region. The pass gate may be connected to pass gates of SRAM cells adjacent in the second direction. In each of the SRAM cells, the pull-down gate and the pass gate, which are arranged in a same active region, may share a junction region.

The sharing gate to connect the pull-down gate and the pull-up gate may be arranged point-symmetrically with respect to the center point of the SRAM cell. The pass gate may be arranged point-symmetrically with respect to the center point of the SRAM cell.

In the I-type SRAM cell, the pull-down gate, the pull-up gate, and the pass gate are arranged in the same direction. Thus, the respective gates exhibit the same current change effect for stress. When the piezoelectric is attached to the gates to apply a tensile stress as illustrated in FIG. 1, performance may be improved according to the increase of current.

Referring to FIG. 3B, the SRAM cell may include a plurality of active regions isolated from each other and a plurality of transistors formed over the respective active regions. The respective active regions are defined and isolated by an isolation region. Each of rectangles isolated by a solid line indicates an SRAM cell. As illustrated in FIG. 3B, the SRAM cells may be arranged in the first and second directions. SRAM cells adjacent in the first and second directions may be arranged mirror-symmetrically with each other.

The SRAM cell may include an NMOS active region N-type well (NW) and a PMOS active region P-type well (PW). The NMOS active region and the PMOS active region are isolated by the isolation region. The NMOS active regions and the PMOS active regions may be connected to the NMOS active region or the PMOS active region adjacent in the second direction, thereby forming an O-type active region.

Each of the SRAM cells may include a pull-down gate, a pull-up gate, and a pass gate. The pull-down gate and the pull-up gate may be electrically connected to each other through a sharing gate crossing the NMOS active region and the PMOS active region. The pass gate may be formed in a line type extending in the first direction. In each of the SRAM cells, the pull-down gate and the pass gate, which are arranged in the same active region, may share a junction region.

In the O-type SRAM cell, the pull-down gate and the pull-up gate are arranged in the same direction, and the pass gate is arranged in a direction perpendicular to the pull-down gate and the pull-up gate. However, since the pass gate is an N-channel, the pass gate exhibits the same current change effect in directions perpendicular and parallel to the gate direction. Thus, the respective gates exhibit the same current change effect for stress. When the piezoelectric is attached to the gates to apply a tensile stress as illustrated in FIG. 1, performance may be improved according to the increase of current.

Figure 4:
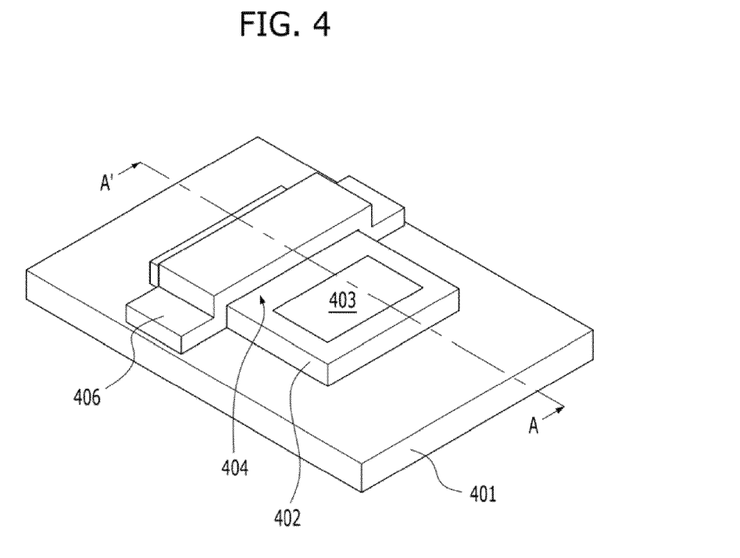
FIG. 4 is a perspective view of a power management integrated circuit (PMIC) to which the embodiment of the present invention is applied.

FIG. 4 is a perspective view of a power management integrated circuit (PMIC) to which the present invention is applied.

A modern power device uses a switching mode power supply (SMPS) to regulate a device using a high voltage of several tens of voltages (V) and a high current of several amperes (A) to a desired voltage while switching the device at high speed, in order to increase power efficiency.

In general, a power device occupies a great part of the PMIC and a logic device occupies a small part of the PMIC. In particular, the power device may use a low-side NMOS transistor and a high-side NMOS transistor as switching transistors, thereby reducing the area of the circuit.

A conventional PMIC includes a logic device and a power device formed over a substrate. The PMIC may be formed over a printed circuit board (PCB). The logic device and the power device are arranged to be spaced at a predetermined distance from each other.

In the conventional PMIC, however, as a high voltage and a high current are applied, a lot of heat is generated from a high-voltage region, and local heat may need to be efficiently dissipated. Furthermore once the temperature increases, the current of the power device including NMOS transistors is reduced by the increasing temperature and the efficiency of the power device is reduced in the same manner.

This embodiment of the present invention provides a PMIC that may efficiently dissipate heat of a power device and pass a sufficient amount of current even though heat is generated.

The PMIC includes a heat dissipating plate over the power device so as to dissipate heat of the power device. Furthermore, the PMIC applies a tensile stress to the power device through the heat dissipating plate, thereby increasing the conductivity of the device.

Figure 5:
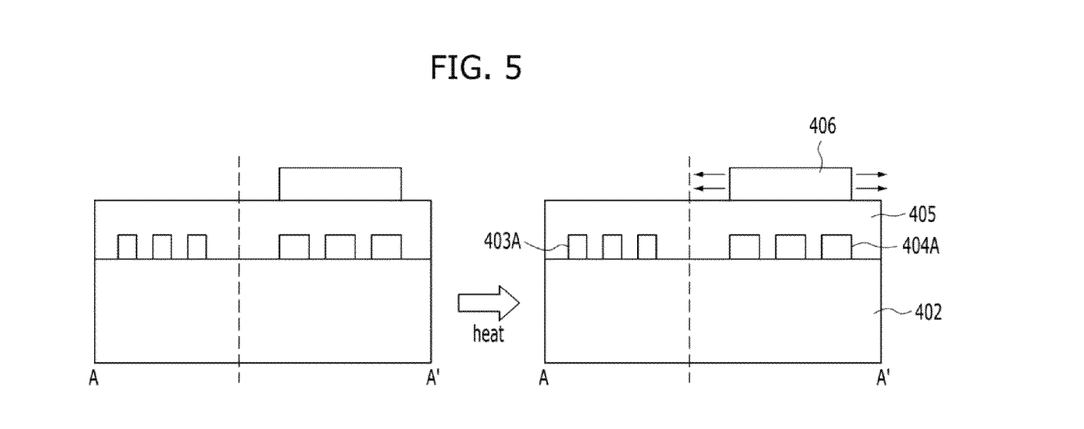
FIG. 5 is a cross-sectional view taken along line A-A' of FIG. 4.

FIG. 5 is a cross-sectional view taken along line A-A' of FIG. 4. In order to promote understanding, the same reference numerals are used in FIGS. 4 and 5.

Referring to FIGS. 4 and 5, the PMIC may include a semiconductor package having passed through a device and packaging process, and may be formed over a PCB 401. The PMIC may include a substrate 402 including a logic device 403 and a power device 404 and a heat dissipating plate 406 locally-formed over the power device 404. The substrate 402 may include a semiconductor package having passed through a device and packaging process. At this time, each of the logic device 403 and the power device 404 may include a device region in which a predetermined structure is formed. The logic device 403 and the power device 404 of the PMIC may be arranged to be spaced at a predetermined distance from each other. That is, the logic device 403 and the power device 404 are spaced at such a sufficient distance that interference does not occur when the heat dissipating plate 406 is formed and noise caused by the power device 404 using a high voltage may be prevented.

The logic device 403 and the power device 404 may be formed over the substrate 402. Furthermore, the logic device 403 and the power device 404 may include structures 403A and 404A formed over the substrate 402. The structures 403A of the logic device and the structures 404A of the power device may be spaced from each other with a larger distance than a distance between the structures of the respective devices. Each of the structures may include a conductive pattern such as a transistor. The structure 404A of the power device may include an NMOS transistor.

A passivation layer 405 is formed over the substrate 402 including the structures 403A and 404A. The passivation layer 405 may include an insulator. The passivation layer 405 may include silicon nitride.

A heat dissipating plate 406 is formed over the passivation layer 405 of the power device region. The heat dissipating plate 406 may be patterned to be locally formed, for example, only over the power device 404.

The heat dissipating plate 406 serves to dissipate heat generated from the power device 404 and simultaneously apply stress to the power device 404. That is, when heat is generated from the power device 404, the heat dissipating plate 406 may be expanded to apply a tensile stress to the power device 404. In another embodiment, when the heat dissipating plate 406 is connected to the bottom of a semiconductor package serving as a heat sink, heat may be more efficiently dissipated.

The heat dissipating plate 406 may include a metallic material. The heat dissipating plate 406 may include a metal having a larger thermal expansion coefficient than the power device 404. The heat dissipating plate 406 may include a bimetal. The bimetal is formed by attaching two kinds of metal plates having different thermal expansion coefficients. The bimetal may apply a stress to the power device 404, using such a characteristic that a metal having a large thermal expansion coefficient is expanded more than a metal having a small thermal expansion coefficient.

In another embodiment, the heat dissipating plate 406 may include a metal having a larger thermal expansion coefficient than silicon nitride. In this case, silicon nitride is applied as a passivation material of the chip in which the logic device 403 and the power device 404 are formed, and a metal having a larger thermal expansion coefficient than silicon nitride is formed over the passivation layer 405, thereby obtaining the same effect as the bimetal. For example, the heat dissipating plate 406 may include aluminum (Al). Since the thermal expansion coefficient of silicon nitride ranges from 1.8 to 3.3 ppm/C and the thermal expansion coefficient of Al is 23.6 ppm/C, a strong stress may be applied to the power device 404.

When the heat dissipating plate 406 is locally formed over the power device 404, heat generated from the power device 404 may be dissipated through the heat dissipating plate 406 having a high thermal conductivity. Furthermore, when heat is generated, a stress is generated by the heat dissipating plate 406, and a tensile stress is applied to the power device 404 due to a difference in thermal expansion coefficient. As a result, in the power device 404 including NMOS transistors, the conductivity reduction caused by heat may be compensated for through the increase in conductivity by the tensile stress. Thus, the efficiency of the DC-DC converter may be maintained to thereby compensate for the current reduction caused by the heat generated from the power device.

Furthermore, as the heat dissipating plate 406 is locally formed, for example, only over the power device 404, the heat dissipating plate 406 may dissipate heat, for example, only from the power device 404, without having an effect on the logic device 403 from which excessive heat is not generated.

In this embodiment of the present invention, the PMIC was taken an example for description. However, the embodiment to compensate for a heat loss of the device through the heat dissipating plate is not limited to the PMIC, but may be applied to an IC that discharges a lot of heat because a local core such as a micro controller unit (MCU) has a high clock speed.

As such, the technical idea of the present invention has been described in detail in accordance with the above embodiment. However, the embodiment is only an example for description, and does not it the technical idea of the present invention. Furthermore, it may be understood by those skilled in the art that various modifications may be made without departing from the scope of the present invention.

Figure 6A:
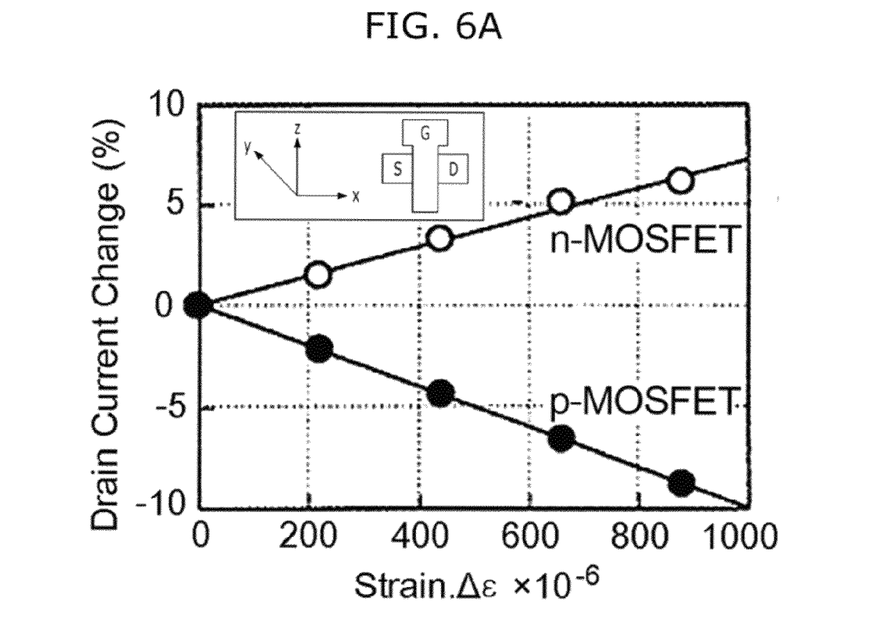
FIGS. 6A and 6B are graphs illustrating characteristic changes of devices depending on a gate direction and a stress.
Figure 6B:
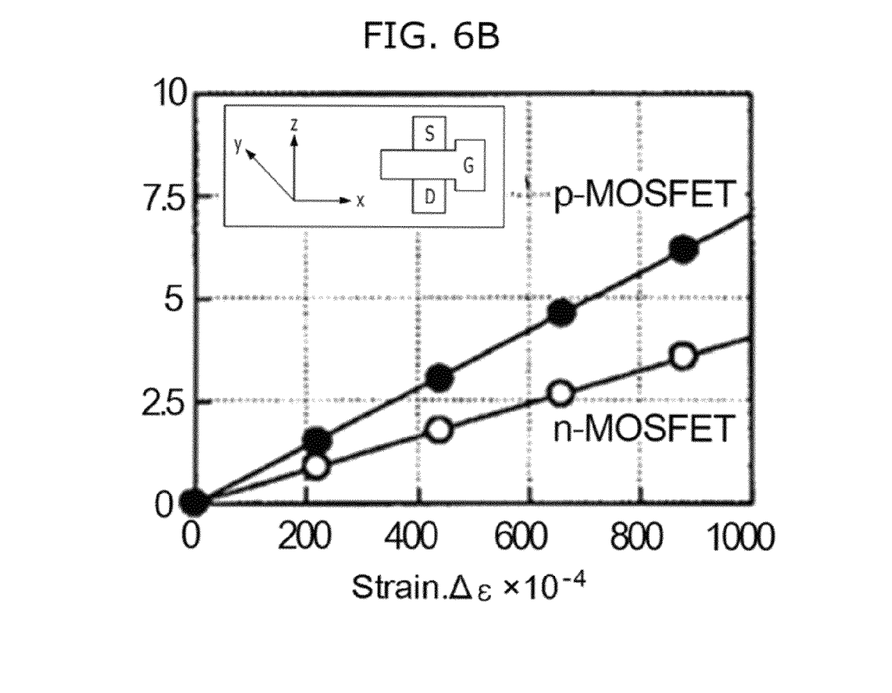

FIGS. 6A and 6B are graphs illustrating characteristic changes of the respective devices depending on the gate direction and stress. FIG. 6A is a graph illustrating current changes depending on stress applied in a direction perpendicular to the gate direction, and FIG. 6B is a graph illustrating current changes depending on stress applied in a direction parallel to the gate direction.

Referring to FIG. 5A, when stress is applied in the direction perpendicular to the gate direction, the current of an NMOS transistor increases with the increase of strain, but the current of a PMOS transistor decreases with the increase of strain. Thus, although the pass gate is arranged in a direction perpendicular to the pull-down gate and the pull-up gate as illustrated in FIG. 3B, the same current change effect may be obtained.

Referring to FIG. 6B, when stress is applied in the direction parallel to the gate direction, the currents of the PMOS and NMOS transistors increase with the increase of strain. Thus, although the pull-down gate and the pull-up gate are arranged in the same direction as illustrated in FIGS. 3A and 3B, the same current change effect may be obtained.

Figure 7A:
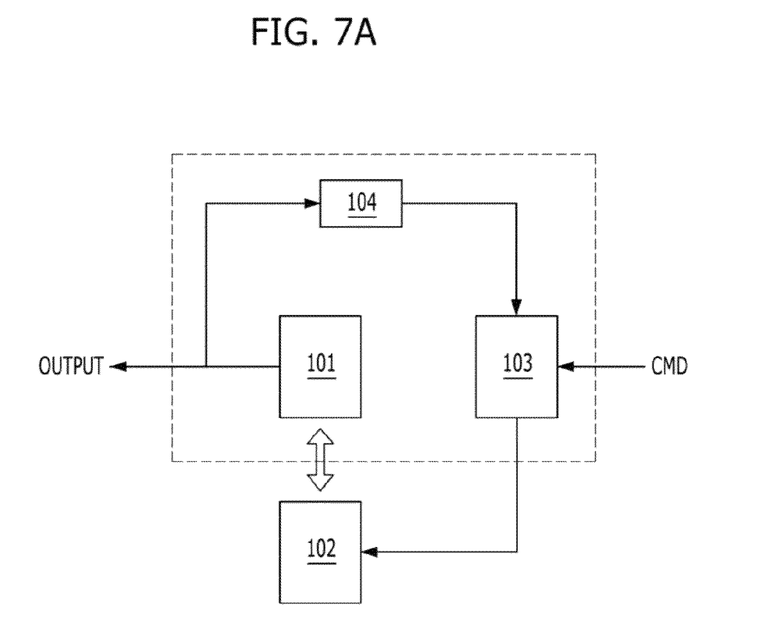
FIGS. 7A and 7B are block diagrams illustrating a semiconductor device and an operating method thereof in accordance with an embodiment of the present invention.
Figure 7B:
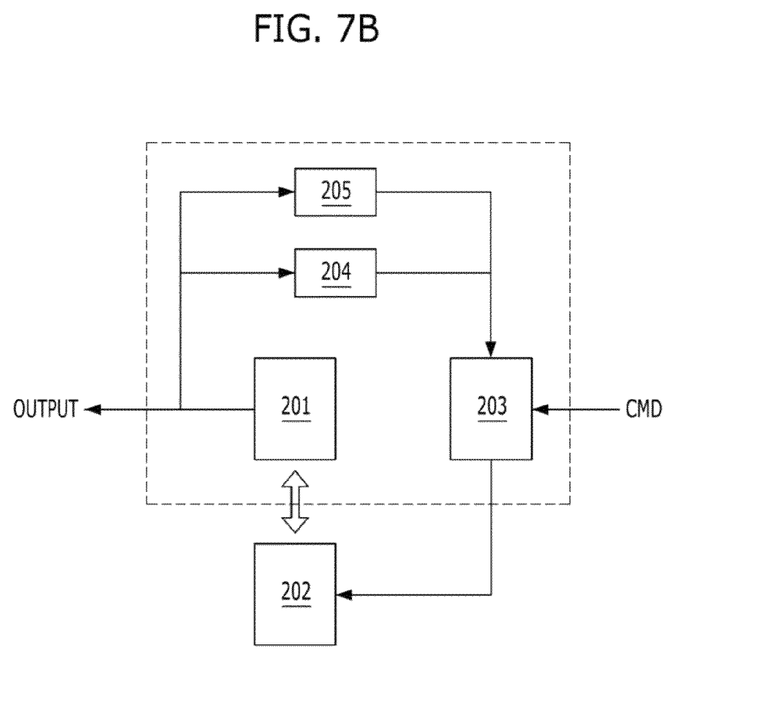

FIGS. 7A and 7B are block diagrams illustrating a semiconductor device and an operating method thereof in accordance with an embodiment of the present invention. FIG. 7A is a block diagram illustrating a semiconductor device in accordance with a first embodiment of the present invention. FIG. 7B is a block diagram illustrating a semiconductor device in accordance with a second embodiment of the present invention.

Referring to FIG. 7A, the semiconductor device may include a device 101, a piezoelectric 102, a control unit 103, and a comparison unit 104. A region indicated by a dotted line may be constructed as one chip. That is, the device 101, the control unit 103, and the comparison unit 104 may be included in one chip. The substrate illustrated in FIG. 1 may include the device 101 or the chip indicated by the dotted line.

The semiconductor device in accordance with the first embodiment of the present invention may satisfy both of a low power operation and a high performance operation, which may be controlled by the control unit 103 to generate or maintain a bias according to a command inputted from outside and the comparison unit 104 to compare the performance of the device 101 to performance required from the command. The control unit 103 may include a bias generation circuit or an internal voltage generation circuit.

The device 101 may include any one device selected from the group consisting of SRAM, Flash memory, DRAM, digital logic, and a converter (for example, a DC-DC converter having power transistors arranged in the same direction) and having a gate direction fixed to one side. At this time, SRAM may include an I-type SRAM or an O-type SRAM.

A piezoelectric 102 is attached to the device 101, and serves to generate a mechanical strain through a voltage received from the control unit 103 and apply a stress to the device 101. The piezoelectric 102 may include a material that is mechanically strained, that is, expanded or contracted by an applied voltage. The piezoelectric 102 may include a ferroelectric ceramic. For example, the ferroelectric ceramic may include any one selected from the group consisting of PZT ($Pb(Ti, Zr)O_3$), $PbTiO_3$, and $BaTiO_3$. Furthermore, the piezoelectric 102 may include a piezoelectric single crystal (for example, quartz) or zinc oxide (ZnO). The piezoelectric 102 is not limited thereto, and may include all piezoelectric materials having large output mechanical energy with respect to input electricity.

The high performance mode and the low power mode will be described in detail as follows.

During the high performance mode, a command CMD for high performance is inputted from outside. The control unit 103 receiving the command generates a bias and applies the generated bias to the piezoelectric 102, and the piezoelectric 102 receiving the voltage applies a tensile stress to the device 101, thereby increasing current and improving the performance of the device. At this time, the comparison unit 104 to measure the performance of the device 101 compares the performance of the device 101 when a voltage is not applied to the performance of the device 101 receiving the stress from the piezoelectric 102, and simultaneously compare the performance of the device 101 to the performance required from the command applied from outside. Then, the comparison unit 104 transmits a signal to the control unit 103.

When the performance of the device 101 is not changed or does not reach the required performance, the control unit 103 may generate a larger bias voltage and apply the generated bias voltage to the piezoelectric 102.

When the performance of the device 101 is equal to the required performance, the control unit 103 may continuously apply the same bias voltage to the piezoelectric 102 to maintain high performance.

During the low power mode, a command CMD for low power is applied from outside. The control unit 103 receiving the command may cut off the voltage having been applied to the piezoelectric 102 such that the tensile stress is not applied to the device 101 from the piezoelectric 102. When no voltage is applied to the piezoelectric 102, no stress is applied to the device 101. Thus, a small current is passed, and a leakage current may be reduced.

As the device 101 having the piezoelectric 102 attached thereto is formed, one device may be used to perform both the high performance mode and the low power mode. Furthermore, when the case in which a voltage is not applied is set to the low power mode during device fabrication, leakage current may be reduced in a standby state, and thus standby power consumption may be reduced.

Tables 1 and 2 compare characteristics of a comparative embodiment and this embodiment of the present invention. Table 1 shows the characteristics of the comparative embodiment, and Table 2 shows the characteristics of this embodiment of the present invention.

TABLE 1

| Device selection | Mode selection | Standby power | Power consumption | Performance |
|---|---|---|---|---|
| Low power | Impossible | Low | Low | Low |
| High performance | | High | High | High |

TABLE 2

| Device selection | Mode selection | Standby power | Power consumption | Performance |
|---|---|---|---|---|
| This embodiment | Low power | Low | Low | Low |
| | High performance | Low | High | High |

In the comparative embodiment as shown in Table 1, the device for low power or the device for high performance is selected, and each device may not select a mode. That is, the device for low power may be operated, for example, only in the low power mode, and the device for high performance may be operated, for example, only in the high performance mode. As a result, the devices for the respective modes are required.

In this embodiment of the present invention as shown in Table 2, one device may be used to select the low power mode or the high performance mode. That is, since the two operation modes may be performed through one device, devices for the respective modes may not need to be formed separately, which may make it possible to significantly improve the process margin.

In the low power mode, the comparative embodiment and this embodiment of the present invention maintain low states in standby power, power consumption and performance.

However, while the device for high performance in the comparative embodiment maintains a high state in standby power, this embodiment of the present invention maintains a low state in standby power even though operated in the high performance mode. In this embodiment of the present invention, a low standby current flows in both the low power mode and the high performance mode. Thus, leakage current in the standby state may be reduced to decrease standby power consumption.

Referring to FIG. 7B, the semiconductor device may include a device 201, a piezoelectric 202, a control unit 203, a comparison unit 204, and a sensing unit 205. A region indicated by a dotted line may be constructed as one chip. That is, the device 201, the control unit 203, the comparison unit 204, and the sensing unit 205 may be included in one chip. The substrate illustrated in FIG. 1 may include the device 201 or the chip indicated by the dotted line.

The semiconductor device in accordance with the second embodiment of the present invention may satisfy both of the low power mode and the high performance mode, and may compensate for characteristic degradation caused by heat generated during the operation of the device 201. The low power mode and the high performance mode may be controlled through the control unit 203 to generate or maintain a bias according to a command applied from outside, the comparison unit 204 to compare the performance of the device 201 to performance required from the command, and the sensing unit 205 to measure the temperature of the device 201. The control unit 203 may include a bias generation circuit or an internal voltage generation circuit.

The device 201 may include any one device selected from the group consisting of SRAM, Flash memory, DRAM, digital logic, and a converter (for example, a DC-DC converter having power transistors arranged in the same direction) and having a gate direction fixed to one side. At this time, SRAM may include an I-type SRAM or an O-type SRAM.

A piezoelectric 202 is attached to the device 201, and serves to generate a mechanical strain through a voltage received from the control unit 203 and apply a stress to the device 201. The piezoelectric 202 may include a material, which is mechanically strained, that is, expanded or contracted by an applied voltage. The piezoelectric 202 may include a ferroelectric ceramic. For example, the ferroelectric ceramic may include any one selected from the group consisting of PZT ($Pb(Ti, Zr)O_3$), $PbTiO_3$, and $BaTiO_3$. Furthermore, the piezoelectric 202 may include a piezoelectric single crystal (for example, quartz) or zinc oxide (ZnO). The piezoelectric 202 is not limited thereto, and may include all piezoelectric materials having large output mechanical energy with respect to input electricity.

The high performance mode and the low power mode will be described in detail as follows.

During the high performance mode, a command CMD for high performance is applied from outside. The control unit 203 receiving the command generates a bias and applies the generated bias to the piezoelectric 202, and the piezoelectric 202 receiving the voltage applies a tensile stress to the device 201, thereby increasing current and improving the performance of the device. At this time, the comparison unit 204 to measure the performance of the device 201 compares the performance of the device 201 when no voltage is applied to the performance of the device 201 receiving the stress from the piezoelectric 202, and simultaneously compare the performance of the device 201 to the performance required from the command applied from outside. Then, the comparison unit 204 transmits a signal to the control unit 203.

When the performance of the device 201 is not changed or does not reach the required performance, the control unit 203 may generate a larger bias and apply the generated bias to the piezoelectric 202.

When the performance of the device 201 is equal to the required performance, the control unit 203 may continuously apply the same bias to the piezoelectric 202 so as to maintain high performance.

During the low power mode, a command CMD for low power is inputted from outside. The control unit 203 receiving the command may cut off the voltage having been applied to the piezoelectric 202 such that the tensile stress is not applied to the device from the piezoelectric 202. When no voltage is applied to the piezoelectric 202, no stress is applied to the device 201. Thus, a small current is passed, and a leakage current may be reduced.

As the device 201 having the piezoelectric 202 attached thereto is formed, one device may be used to perform the high performance mode or the low power mode. Furthermore, when the case in which no voltage is applied is set to the low power mode during device fabrication, leakage current may be reduced in a standby state, and thus standby power consumption may be reduced.

An operating method for preventing characteristic degradation of the device may be performed as follows.

First, the sensing unit 205 memorizes a temperature that has no effect on the characteristic degradation of the device 201 when the device 201 is not operated, compares the temperature of the device 201 during the operation of the device 201 to the existing temperature, and transmits a signal to the control unit 203. While the device 201 is operated, heat may be inevitably generated. However, when excessive heat is generated, the operating characteristics of the device may be inevitably degraded. For example, the performance of the device may be degraded.

Thus, in accordance with the second embodiment of the present invention, the temperature of the device 201 is continuously compared to the temperature that has no effect on characteristic degradation. When the temperature of the device 201 exceeds the reference temperature, a signal may be transmitted to the control unit 203 to apply a larger bias to the piezoelectric 202. When a larger bias is applied to the piezoelectric 202, a larger tensile stress is applied to the device 201 attached to the piezoelectric 202. Thus, it may be possible to prevent the performance degradation caused by heat.

As the sensing unit 205 to measure the temperature of the device 201 is added, it may be possible to prevent and compensate for the characteristic degradation caused by heat during the operation of the device 201. Both of this embodiment of the present invention and the comparative embodiment include the sensing unit, but a semiconductor device including, for example, only the sensing unit may be formed to prevent the characteristic degradation of the device.

In accordance with the embodiments of the present invention, as the piezoelectric is attached on the device, it is possible to form the device that may satisfy the low power mode and the high performance mode at the same time, depending on whether the voltage of the piezoelectric is applied or not.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
    a substrate comprising a plurality of transistors; and
    a piezoelectric formed to be contacted with the substrate,
    wherein the piezoelectric is formed expendably in a direction parallel to a gate direction of the transistors,
    wherein the substrate comprises a semiconductor chip which a packaging process is completed,
    wherein the piezoelectric has a larger size than the substrate.

2. The semiconductor device of claim 1, wherein the substrate comprises any one selected from the group consisting of SRAM, Flash memory, DRAM, digital logic, and a converter.

3. The semiconductor device of claim 1, wherein the substrate comprises a device in which the gate direction is arranged to one direction.

4. The semiconductor device of claim 1, wherein the piezoelectric comprises one material selected from the group consisting of ferroelectric ceramic, piezoelectric single crystal, and zinc oxide.

5. The semiconductor device of claim 1, wherein the piezoelectric comprises any one ferroelectric ceramic selected from PZT ($Pb(Ti, Zr)O_3$), $PbTiO_3$, and $BaTiO_3$.

6. The semiconductor device of claim 1, wherein the substrate comprises a control unit and a comparison unit.

7. The semiconductor device of claim 1, wherein the substrate comprises a control unit, a comparison unit, and a sensing unit.

8. A semiconductor device comprising:
    a substrate comprising a plurality of NMOS transistors and a plurality of PMOS transistors which a packaging process is completed; and
    a piezoelectric formed to be contacted with the substrate,
    wherein the piezoelectric is formed expendably in at least a direction parallel to a gate direction of the PMOS transistors,
    wherein the piezoelectric has a larger size than the substrate.

9. The semiconductor device of claim 8, wherein each of the NMOS transistors comprises a pull-down transistor and a pass transistor, and each of the PMOS transistors comprises a pull-up transistor.

10. The semiconductor device of claim 9, wherein the substrate comprises an I-type active region.

11. The semiconductor device of claim 10, wherein the pull-down transistor, the pull-up transistor, and the pass transistor are arranged in the same direction.

12. The semiconductor device of claim 9, wherein the substrate comprises an O-type active region.

13. The semiconductor device of claim 12, wherein the pull-down transistor and the pull-up transistor are arranged in the same direction, and the pass transistor is arranged in a direction perpendicular to a gate direction of the pull-down transistor and the pull-up transistor.

14. An operating method executable in a semiconductor device and suitable for operating a semiconductor device having a device, a control unit, a comparison unit, and a piezoelectric, comprising:
    receiving an external command to the control unit;
    supplying, by the control unit, a voltage to the piezoelectric;
    supplying, by the piezoelectric, a stress to the semiconductor device;
    determining performance of the semiconductor device; and
    transmitting a signal representing the determination result to the control unit.

15. The operating method of claim 14, wherein the semiconductor device further comprises a sensing unit and further comprising measuring the temperature of the semiconductor device.

16. The operating method of claim 15, wherein the determining of the performance of the semiconductor device and the measuring of the temperature of the device are performed at the same time.

17. The operating method of claim 14, wherein the semiconductor device comprises one device selected from the group consisting of SRAM, Flash memory, DRAM, digital logic, and a converter.

18. The operating method of claim 14, wherein the piezoelectric comprises one material selected from the group consisting of ferroelectric ceramic, piezoelectric single crystal, and zinc oxide.

19. The operating method of claim 14, wherein the determining performance of the device comprises:
 comparing a performance of the device receiving the stress from the piezoelectric with a performance of the device, when no voltage is applied, in order to measure the performance of the device receiving the stress from the piezoelectric, and
 simultaneously comparing the measured performance of the device receiving the stress from the piezoelectric with a target performance from the external command, in order to transmit a signal to the control unit.

\* \* \* \* \*